United States Patent [19]
Dovek et al.

[11] Patent Number: 5,561,368
[45] Date of Patent: Oct. 1, 1996

[54] BRIDGE CIRCUIT MAGNETIC FIELD SENSOR HAVING SPIN VALVE MAGNETORESISTIVE ELEMENTS FORMED ON COMMON SUBSTRATE

[75] Inventors: Moris M. Dovek, San Carlos; Robert E. Fontana, Jr., San Jose; Virgil S. Speriosu, San Jose; Jaquelin K. Spong, San Jose, all of Calif.

[73] Assignee: International Business Machines Corporation, Armonk, N.Y.

[21] Appl. No.: 334,659

[22] Filed: Nov. 4, 1994

[51] Int. Cl.[6] .................................................. G01R 33/02
[52] U.S. Cl. ....................... 324/252; 360/113; 338/32 R
[58] Field of Search ........................ 324/207.21, 207.14, 324/207.23, 235, 252, 251, 260, 261, 262, 173, 174; 338/32 R; 307/309; 360/113; 73/779, 862.69; 327/510

[56] References Cited

U.S. PATENT DOCUMENTS

| | | | |
|---|---|---|---|
| 3,613,000 | 10/1971 | Weir et al. | 324/207.21 X |
| 4,401,944 | 8/1983 | Narimatsu et al. | 324/252 X |
| 4,847,584 | 7/1989 | Pant | 324/252 X |
| 4,851,771 | 7/1989 | Ikeda et al. | 324/252 X |
| 5,159,513 | 10/1992 | Dieny et al. | 360/113 |
| 5,168,760 | 12/1992 | Wun-Fogle et al. | 73/862.69 X |
| 5,206,590 | 4/1993 | Dieny et al. | 324/252 |
| 5,247,278 | 9/1993 | Pant et al. | 338/32 R |
| 5,287,238 | 2/1994 | Baumgart et al. | 324/252 X |
| 5,341,261 | 8/1994 | Dieny et al. | 360/113 |
| 5,373,238 | 12/1994 | McGuire et al. | 324/252 |
| 5,408,377 | 4/1995 | Gurney et al. | 324/252 X |

OTHER PUBLICATIONS

Bajorek et al., "Magnetoresistive Current Sensor", IBM Technical Disclosure Bulletin, vol. 18, No. 8, Jan. 1976, pp. 2745–2748.
Bajorek et al., "A Permalloy Current Sensor", IEEE Transactions on Magnetics, vol. MAG-6, No. 6, Nov. 1976, pp. 813–815.
Daughton et al., "GMR Materials for Low Field Applications", IEEE Transactions on Magnetics, vol. 29, No. 6, Nov. 1993, pp. 2705–2710.
Feng, "Self–biased Magnetoresistive Bridge Configuration for Current Measurement", IBM Technical Disclosure Bulletin, vol. 18, No. 11, Apr. 1976, pp. 3847–3851.
Heim et al., "Design and Operation of Spin Valve Sensors", IEEE Transactions on Magnetics, vol. 30, No. 2, Mar. 1994, pp. 316–321.
Lin et al., "Improved Exchange Coupling Between Ferromagnetic Ni—Fe and Antiferromagnetic Ni—Mn–based Films", Applied Physics Letters, vol. 65, No. 9, 29 Aug. 1994, pp. 1183–1185.
Speriosu et al., "Role of Interfacial Mixing in Giant Magnetoresistance", Physical Review B, vol. 47, No. 17, 1 May 1993, pp. 11579–11582.

Primary Examiner—Sandra L. O'Shea
Assistant Examiner—Jay M. Patidar
Attorney, Agent, or Firm—Thomas R. Berthold

[57] ABSTRACT

A magnetic field sensor uses four individual magnetoresistive spin valve elements electrically connected in a bridge circuit. The spin valve elements are lithographically formed on the same substrate with their free layers having their magnetization axes parallel to one another. An electrically conductive fixing layer is formed on the substrate but is insulated from the spin valve elements. The application of current through the fixing conductor during fabrication of the field sensor fixes the direction of magnetization of two of the pinned layers to be antiparallel to the direction of magnetization of the other two pinned layers. The bridge circuit output voltage is responsive to an external magnetic field in the plane of the sensor. By appropriate fixing of the direction of magnetization of the pinned layers during sensor fabrication, and appropriate connection to the input and output leads, the bridge circuit output voltage is a measure of either the magnetic field or field gradient. The fixing conductor, or a separate current strap formed on the substrate, can be used to pass an unknown current over the sensor, in which case the bridge circuit output voltage is a measure of the unknown current.

7 Claims, 6 Drawing Sheets

SECTION X–X

BRIDGE CIRCUIT MAGNETIC FIELD SENSOR HAVING SPIN VALVE MAGNETORESISTIVE ELEMENTS FORMED ON COMMON SUBSTRATE

TECHNICAL FIELD

This invention relates to magnetic field sensors, and in particular to magnetic field sensors that use magnetoresistive (MR) sensor elements in bridge circuits.

BACKGROUND OF THE INVENTION

Magnetic field sensors are in widespread commercial use with applications such as linear and rotary encoders, proximity detectors, and earth's field magnetometers. One common magnetic field sensor is based on the Hall effect and is used to sense magnetic fields in the range of 100 to 1000 Oersteads (Oe). Another common magnetic field sensor is based on the magnetoresistive (MR) effect in semiconductors or ferromagnetic materials, and is used to sense lower fields and fields at a greater distance than Hall-effect sensors. The MR magnetic field sensor detects magnetic field signals through the resistance changes of a sensing element, fabricated of a magnetic material, as a function of the magnitude and direction of magnetic flux being sensed by the sensing element.

The conventional MR sensor operates on the basis of the anisotropic magnetoresistive (AMR) effect in which a component of the sensing element resistance varies as the square of the cosine of the angle between the magnetization in the sensing element and the direction of sense current flowing through the sensing element. The external magnetic field being sensed causes a change in the direction of magnetization in the sensing element, which in turn causes a change in resistance in the sensing element and a corresponding change in the sensed current or voltage.

Electrical bridge circuits made of AMR materials are used as magnetic field sensors to sense fields below approximately 50 Oe. An example of a magnetic field sensor using AMR elements in a Wheatstone bridge circuit is described in U.S. Pat. No. 5,247,278 assigned to Honeywell. Another example of an AMR Wheatstone bridge circuit, used in conjunction with a current strap to function as a current sensor, is described in *IEEE Transactions on Magnetics*, Vol. MAG-6, November 1976, pp. 813–815.

A different and more pronounced magnetoresistance, called giant magnetoresistance (GMR), has been observed in a variety of magnetic multilayered structures. The essential feature of GMR is that there are at least two ferromagnetic metal layers separated by a nonferromagnetic metal layer. This GMR effect has been found in a variety of systems, such as Fe/Cr, Co/Cu, or Co/Ru multilayers exhibiting strong antiferromagnetic coupling of the ferromagnetic layers, as well as in essentially uncoupled layered structures in which the magnetization orientation in one of the two ferromagnetic layers is fixed or pinned. The physical origin is the same in all types of GMR structures: the application of an external magnetic field causes a variation in the relative orientation of neighboring ferromagnetic layers. This in turn causes a change in the spin-dependent scattering of conduction electrons and thus the electrical resistance of the structure. The resistance of the structure thus changes as the relative alignment of the magnetizations of the ferromagnetic layers changes. A particularly useful application of GMR is a sandwich structure comprising two uncoupled ferromagnetic layers separated by a nonmagnetic metallic spacer layer in which the magnetization of one of the ferromagnetic layers is pinned. The pinning may be achieved by depositing the ferromagnetic layer to be pinned onto an iron-manganese (Fe-Mn) layer to exchange couple the two layers. This results in a spin valve (SV) sensor in which only the unpinned or free ferromagnetic layer is free to rotate in the presence of an external magnetic field. IBM's U.S. Pat. No. 5,206,590 discloses a basic SV sensor. IBM's U.S. Pat. No. 5,159,513 discloses an SV sensor in which at least one of the ferromagnetic layers is of cobalt or a cobalt alloy, and in which the magnetizations of the two ferromagnetic layers are maintained substantially perpendicular to each other at zero externally-applied magnetic field by exchange coupling of the pinned ferromagnetic layer to an antiferromagnetic layer. IBM's U.S. Pat. No. 5,341,261 describes an SV sensor having a thin film of cobalt adjacent to the metallic spacer layer for increased magnetoresistance. The SV sensor that has the most linear response and the widest dynamic range is one in which the magnetization of the pinned ferromagnetic layer is parallel to the signal field, and the magnetization of the free ferromagnetic layer is perpendicular to the signal field. The design and operation of an SV sensor is described by Heim et al. in "Design and Operation of Spin-Valve Sensors", *IEEE Transactions on Magnetics*, Vol. 30, No. 2, March 1994, pp. 316–321.

The use of GMR elements in a bridge circuit for a magnetic field sensor has been suggested by Daughton et al. in "GMR Materials for Low Field Applications", *IEEE Transactions on Magnetics*, Vol. 29, No. 6, November 1993, pp. 2705–2710. That reference suggests that a bridge circuit using a "pinned" GMR structure (i.e., an SV element) may be possible, but states that the device has not yet been demonstrated.

What is needed is a bridge circuit magnetic field sensor that takes advantage of the improved performance of an SV sensor over a conventional AMR sensor.

SUMMARY OF THE INVENTION

The invention is a magnetic field sensor that uses four individual spin valve (SV) elements electrically connected in a bridge circuit. The SV elements are lithographically formed on the same substrate with their free layers having their magnetization axes parallel to one another. An electrically conductive fixing layer is formed on the substrate but insulated from the SV elements. By appropriate heating and cooling of the sensor while a current is applied through the fixing conductor during fabrication of the field sensor, the direction of magnetization of the pinned layers in the SV elements is fixed so that the direction of magnetization of the pinned layers in two of the SV elements is antiparallel to the direction of magnetization of the pinned layers in the other two SV elements. The bridge circuit output voltage is responsive to an external magnetic field in the plane of the sensor. By appropriate fixing of the direction of magnetization of the pinned layers during sensor fabrication, the bridge circuit output voltage is a measure of either the magnetic field or field gradient. The sensor provides a measure of both the magnitude and sign of the magnetic field or magnetic field gradient. The fixing conductor, or a separate current strap formed on the substrate, can be used to pass an unknown current over the sensor, in which case the bridge circuit output voltage is a measure of the unknown current.

For a fuller understanding of the nature and advantages of the present invention, reference should be made to the

DESCRIPTION OF THE PREFERRED EMBODIMENTS

Figure 1:
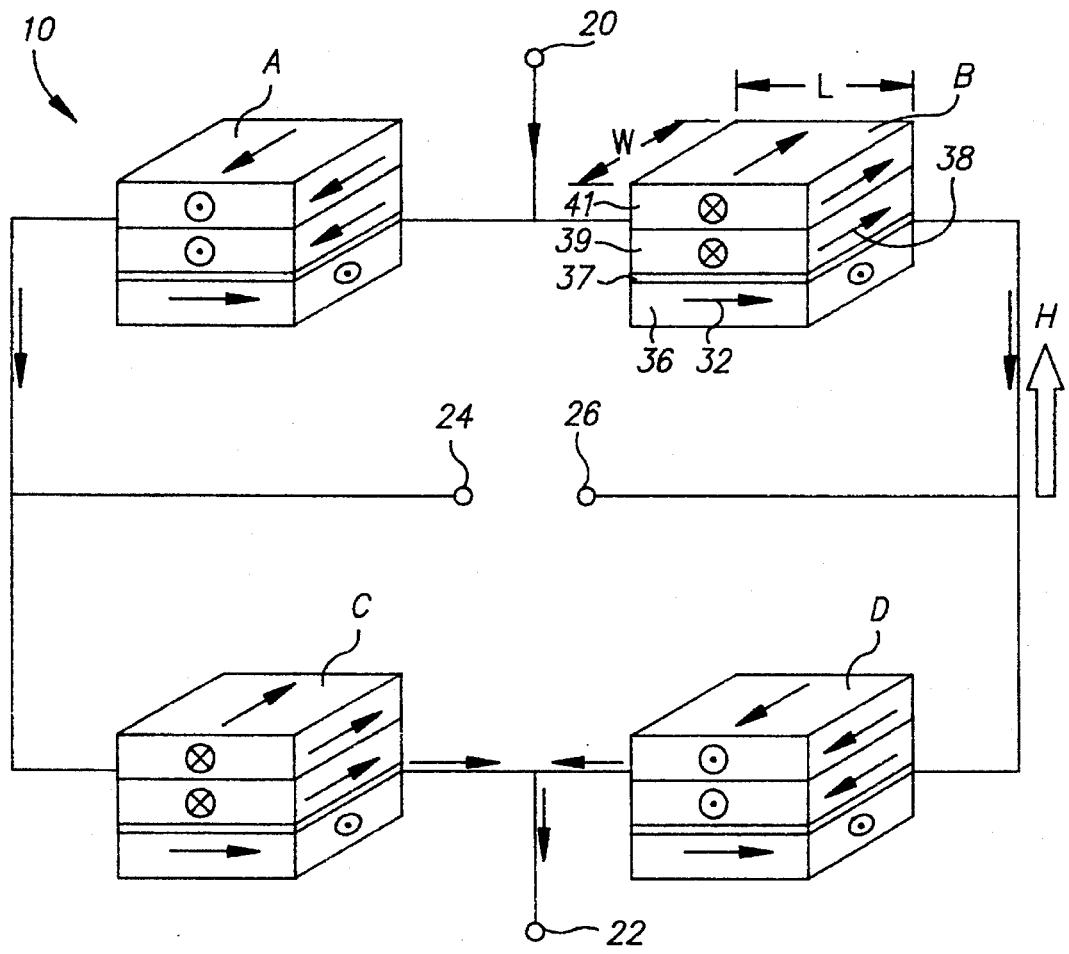
FIG. 1 is a schematic of the bridge circuit field sensor illustrating the magnetic orientations of the various layers making up the SV elements.

Referring first to FIG. 1, the SV bridge circuit magnetic field sensor 10 is shown in a schematic view with four separate SV elements A, B, C, and D arranged in a Wheatstone bridge circuit. For purposes of illustration of the individual layers comprising each of the SV elements A–D, the SV elements are shown in perspective view. In actuality, they are formed in the plane of the figure. Each of the SV elements A–D has a length L and a width W. The SV elements are arranged in the plane such that all of their lengths L are parallel to one another. The magnetic field to be sensed is shown by the arrow H and is in the plane of the figure and perpendicular to the lengths L of the SV elements.

The sensor 10 has a first set of terminal leads 20, 22 located between the first and second SV elements A–B and the third and fourth SV elements C–D, respectively, that serve as the input leads for the sensor. A constant voltage supply (not shown) is coupled across the input leads 20, 22. The sensor 10 has a second set of terminal leads 24, 26 located between SV elements A–C and B–D, respectively, that serve as the output leads for the sensor. The external magnetic field H being sensed causes a change in the resistance in each of the SV elements.

The operation of the sensor 10 can be understood by reference to SV element B in FIG. 1 which depicts the individual layers forming a typical SV element. SV element B comprises a ferromagnetic free layer 36, a nonmagnetic spacer layer 37, a pinned ferromagnetic layer 39, and an antiferromagnetic layer 41 for pinning the adjacent pinned layer 39. The key to operation of the sensor 10 is in the orientation of the relative free and pinned layers in each of the SV elements A–D. As shown in FIG. 1, the preferred direction of the axes of magnetization, in the absence of an applied magnetic field, for all of the free layers in the four SV elements is along the length L of the SV elements. This direction is shown by arrow 32 for free layer 36 in typical SV element B. Thus, the axes of magnetization of the free layers in the SV elements A–D are aligned parallel to one another. Each of the pinned layers, however, has its axis of magnetization (shown by arrow 38 for pinned layer 39 in typical SV element B) oriented perpendicular to the direction of current through its SV element and parallel to the width W of its SV element. However, the direction of magnetization of the pinned layers in SV elements B and C is opposite to the direction of magnetization of the pinned layers in SV elements A and D. Referring again to typical SV element B, the perpendicular angle between the axis of magnetization 38 of the pinned layer 39 and the preferred axis of magnetization 32 of the free layer 36 in the absence of a magnetic field provides the most linear response for the SV elements. A commonly used figure of merit, which estimates the signal capability of the SV element, is the intrinsic magnetoresistance, $\Delta R/R$, computed by dividing the change in resistance (for current parallel and perpendicular to the sensor magnetization) by the average resistance.

Because the SV elements A–D are formed simultaneously on a common substrate and have simultaneously defined lithographical dimensions, the bridge circuit of sensor 10 is balanced so that the differential output voltage $V_{out}$ across terminal leads 24, 26 is approximately zero. When the sensor 10 is exposed to a uniform magnetic field H, the free layers are rotated by an angle while the pinned layers are unaffected, causing a change in the resistances of each SV element A–D. As shown in FIG. 1, H is an applied magnetic field entirely in the plane of the substrate and in a direction perpendicular to the lengths L of the SV elements. However, if the applied magnetic field is out of the plane of the substrate and/or not entirely perpendicular to the lengths L of the SV elements, then the sensor 10 will provide a measure of the amplitude (i.e. both the magnitude and sign) of the component of the applied field that is in the plane of the substrate and in a direction perpendicular to the lengths L of the SV elements.

Figure 2:
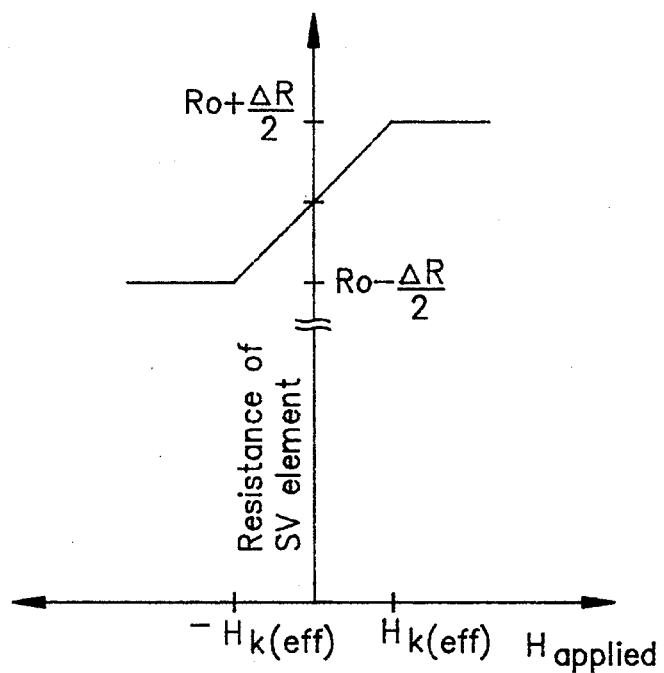
FIG. 2 is a graph of the resistance response of a single SV element as a function of the applied or external magnetic field being sensed.

The resistance response of a single SV element is shown in FIG. 2. For a voltage to appear across output terminal leads 24, 26, the response of elements A and D (their respective resistances RA, RD) must be equal and opposite to the response of elements B and C. As discussed by the previously-cited Heim reference, this relationship is:

$$RA = RD = R_o + \Delta R/2 \times H/H_{k(eff)} \qquad (1)$$

where $R_o$ is the resistance of the SV elements with no applied field, $H_{k(eff)}$ is the effective anisotropy field of the SV elements, and $\Delta R$ is the maximum change in resistance of the SV elements. The equation is valid for an SV element whose pinned layer is perpendicular to the length L of the element and is aligned in the direction of positive applied field H, such as for elements B and C. SV elements A and D have equal resistances for uniform applied field H since they have identical geometries. SV elements B and C have their pinned layers aligned antiparallel to the pinned layers of SV elements A and D, and therefore their response to the applied field H is of opposite sign but equal magnitude:

$$RB = RC = R_o - \Delta R/2 \times H/H_{k(eff)} \qquad (2)$$

The bridge response $V_{out}$ is given by:

$$V_{out} = V_{in} \times \left( \frac{RC}{RA + RC} \right) - V_{in} \times \left( \frac{RD}{RB + RD} \right) \qquad (3)$$

where $V_{in}$ is the supply voltage applied across input terminal leads 20 and 22. Substituting the values for RA, RB, RC, and RD given above, the output voltage is found to be:

$$V_{out} = -V_{in} \times (\Delta R/2R_o) \times H/H_{k(eff)} \qquad (4)$$

As shown by equation (4), the voltage response of the sensor is a measure of the amplitude (i.e., both the magnitude and sign) of an applied field that is entirely in the plane of the sensor substrate and perpendicular to the lengths of the SV elements. If the applied field has components other than in the plane of the substrate and perpendicular to the lengths of the SV elements, then equation (4) is an approximation of the component of the applied field that is in the plane of the substrate and perpendicular to the lengths of the SV elements.

$H_{k(eff)}$ relates to the sensitivity of the bridge circuit field sensor to the applied field H and includes intrinsic crystalline anisotropy in the range of 2–5 Oe and shape anisotropy, which is given approximately by:

$$H_{k(shape)} = 4 \pi M_s (t/W) \tag{5}$$

for a relatively long element of length L, where W is the width of the SV element and t is the thickness of the free layer. $H_{k(eff)}$ is the field that needs to be applied to overcome the energy due to crystalline and shape anisotropy and therefore to orient the free layer perpendicular to its easy axis. For a 50 Å thick Ni-Fe free layer, $H_{k(shape)}$ is 5 Oe for a 10-micron wide SV element and 15 Oe for a 3.3-micron wide SV element. This results in $H_{k(eff)}$ of 10 Oe for a 10-micron wide SV element and 20 Oe for a 3.3-micron wide SV element.

Figure 3:
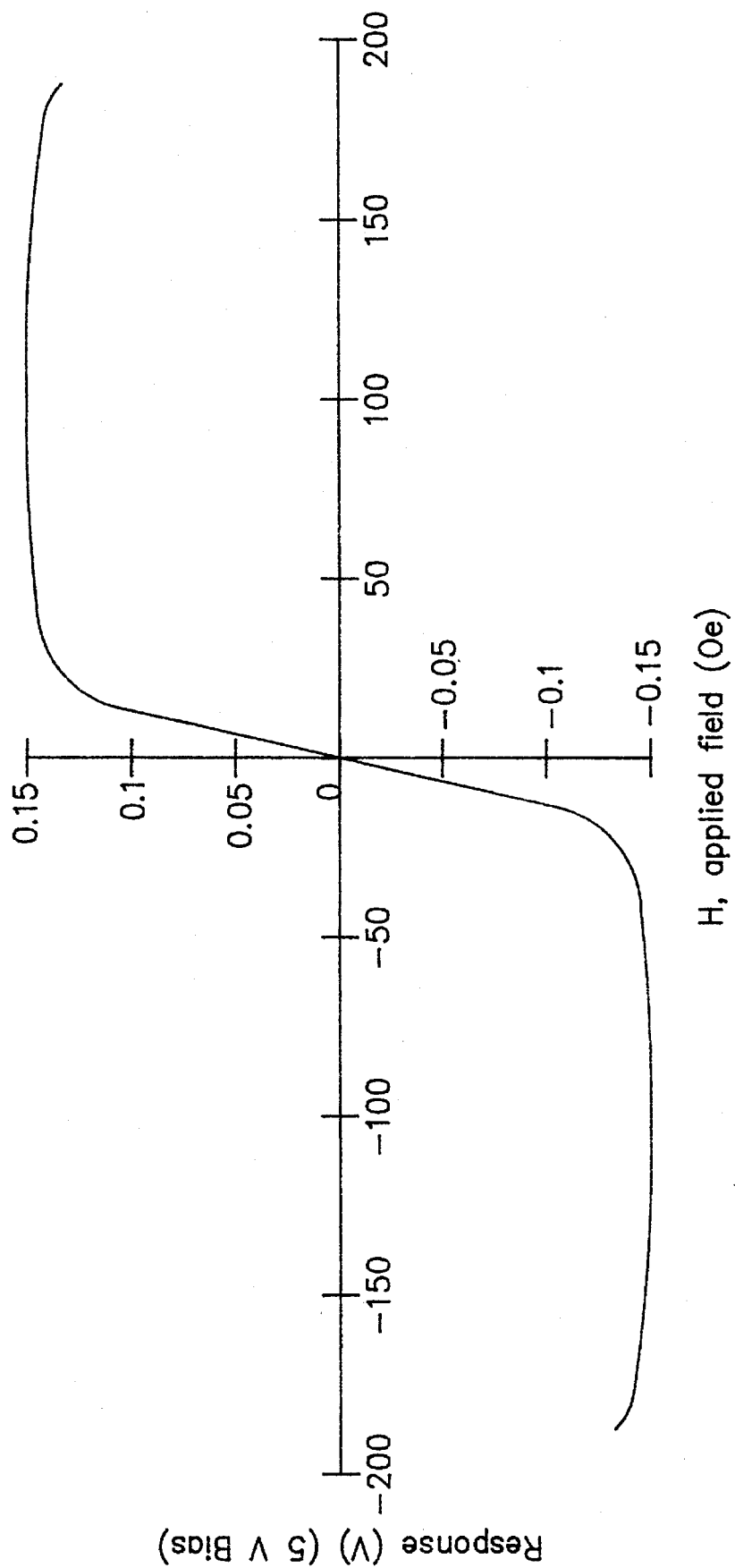
FIG. 3 is a graph of the measured voltage response of the bridge circuit field sensor as a function of the magnetic field being sensed.

Using SV elements with ΔR/R of 6%, sheet resistance of 15 Ohms, width W of 3.3 microns, and length L of 500 microns, the field sensor resistance will change by 136 Ohms as the applied field H is swept from $-H_{k(eff)}$ to $+H_{k(eff)}$. For a supply voltage $V_{in}$ of 5 V, this results in a field sensor output $V_{out}$ that ranges from −150 mV to +150 mV. This is shown in the measured field sensor response in FIG. 3. For an $H_{k(eff)}$ of 20 Oe and a $V_{in}$ of 5 V, this corresponds to a response of 7.5 mV per Oe. This value compares to 1.5 mV per Oe for present commercial AMR sensors.

In the preferred embodiment as shown and described the input power source is a constant voltage supply, the sensor will also function if the input power source is a constant current supply.

Figure 4:
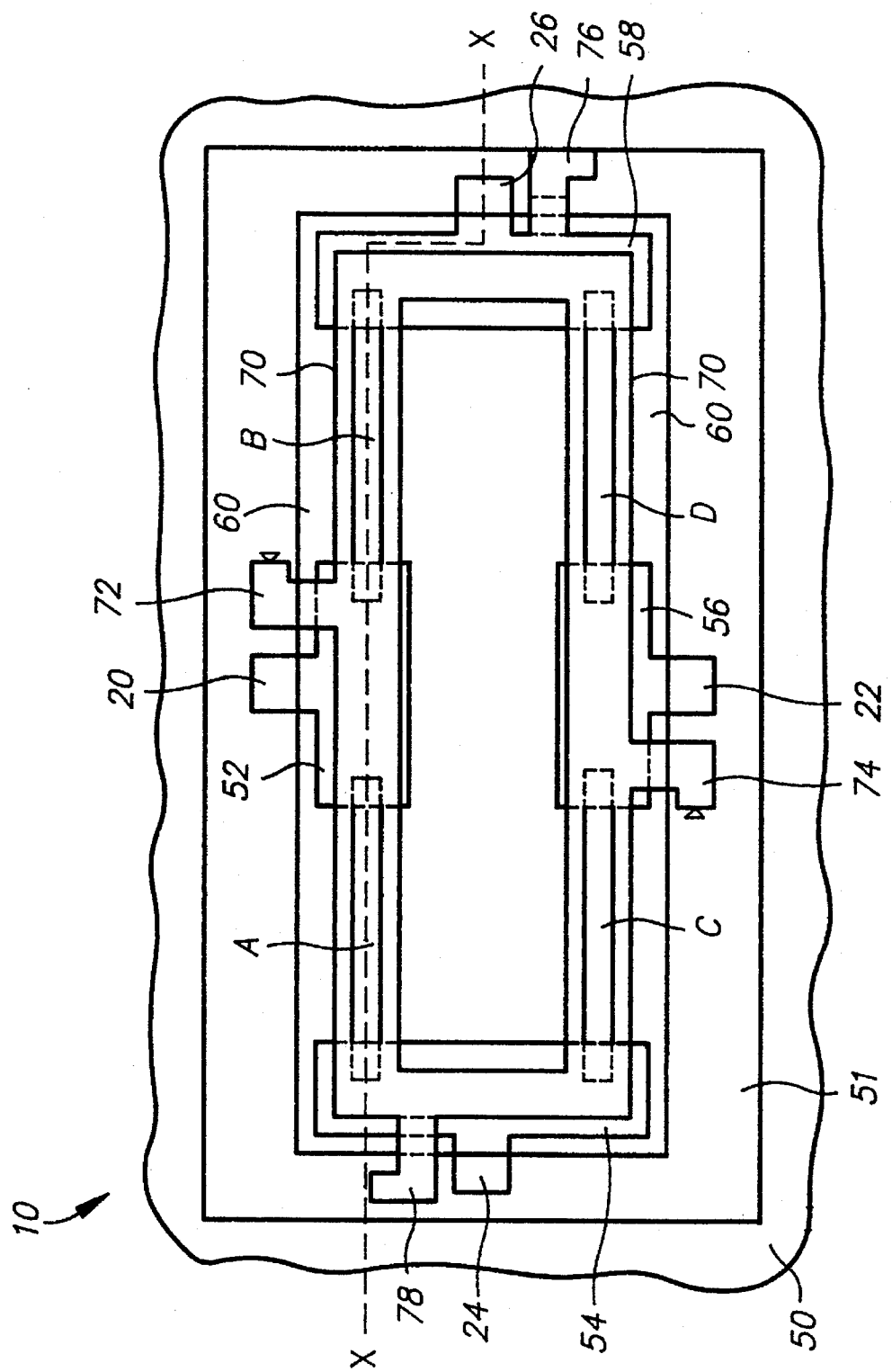
FIG. 4 is a plan view of the bridge circuit field sensor component layers as formed on the substrate.
Figure 5:
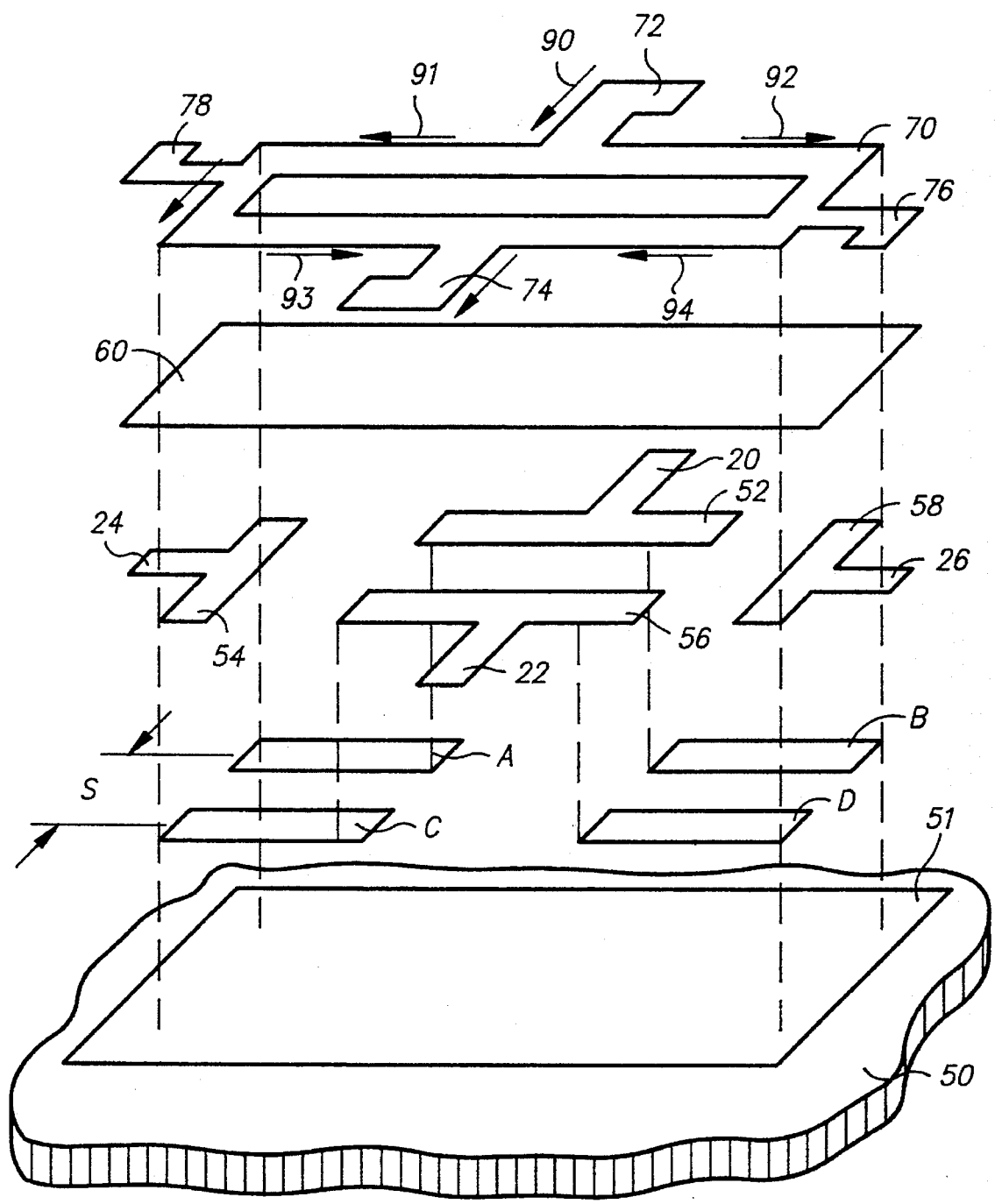
FIG. 5 is an exploded view of the bridge circuit field sensor illustrating the layers formed on the substrate.

The preferred embodiment of the SV bridge magnetic field sensor 10 is shown in FIGS. 4 and 5. FIG. 4 is a view of the specific layers forming the bridge circuit patterned on a silicon (Si) substrate 50, and FIG. 5 is an exploded perspective view of these layers to better illustrate their orientation on substrate 50.

Referring to FIG. 5, a buffer layer 51 is first deposited on Si substrate 50. Then each of the SV elements A–D is formed on buffer layer 51 in the manner to be described later. Thereafter, electrical conductors in the form of pads 52, 54, 56, 58 are patterned over the ends of the respective SV elements A–D to electrically connect the four separate SV elements. Electrical conductor pads 52, 56 interconnect SV elements A–B and C–D, respectively, and include input terminal leads 20, 22 for the sensor 10. Electrical conductor pads 54, 58 interconnect SV elements A–C and B–D, respectively, and include output terminal leads 24, 26 for the sensor 10. An insulator layer 60 is then formed over the electrical conductor pads 52, 54, 56, 58 and the SV elements. Next, an electrically conductive SV element fixing layer 70 is patterned onto the insulator 60. The fixing layer overlays all of the SV elements A–D, but is not electrically connected to them because of insulator layer 60. The SV element fixing layer does not necessarily function during operation of the completed sensor 10 but is used during fabrication of the sensor 10 to permanently pin each of the SV element pinned layers in the manner to be described later.

Figure 6:
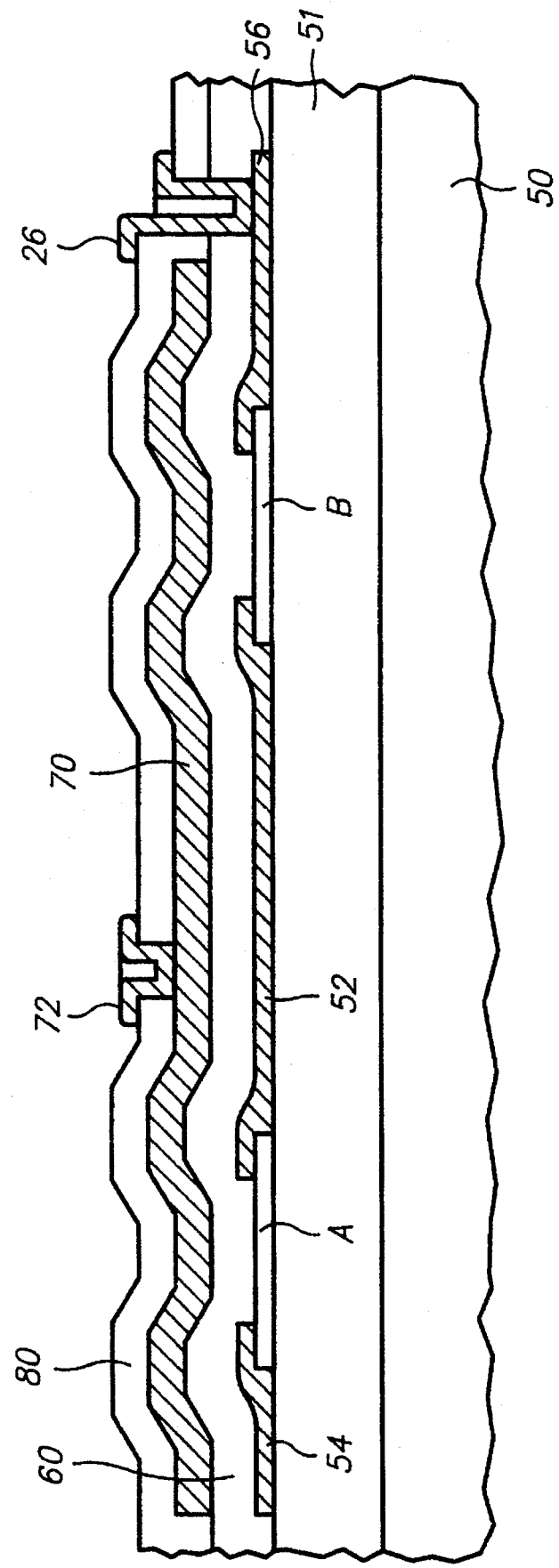
FIG. 6 is a section of the bridge circuit field sensor taken through section X—X of FIG. 4.

The process for fabricating the sensor 10 will be described with reference to FIG. 6, which is a sectional view taken through section X—X of FIG. 4. The sensor 10 is fabricated using conventional thin film deposition, lithographic, and etching processes. A single-crystal semiconductor grade Si wafer serves as the substrate 50. A buffer layer 51 of alumina ($Al_2O_3$) is then deposited by sputtering to a thickness of approximately 1000–2000 Å over the Si substrate 50. The purpose of buffer layer 51 is to provide electrical insulation to the Si substrate 50. The individual SV elements A–D are then formed on buffer layer 51, SV elements A and B being shown in FIG. 6.

Figure 7A:
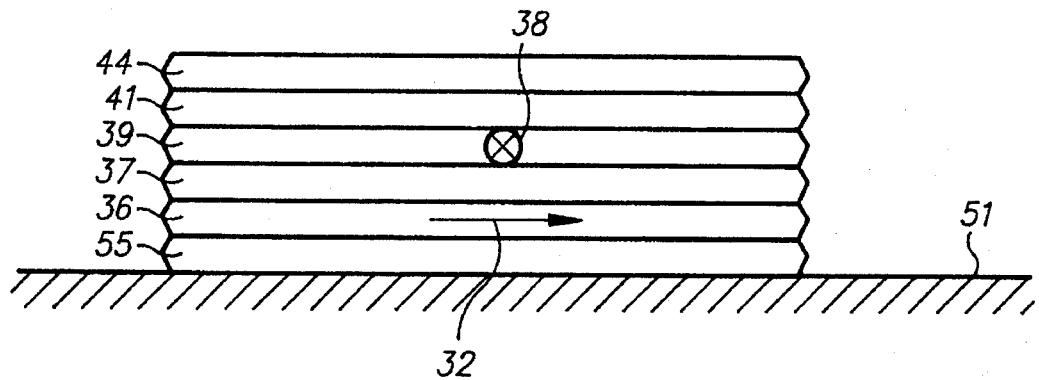
FIGS. 7A–7D are views of the layers forming a typical SV element of the type used to make up the bridge circuit field sensor at various stages of fabrication.
Figure 7B:
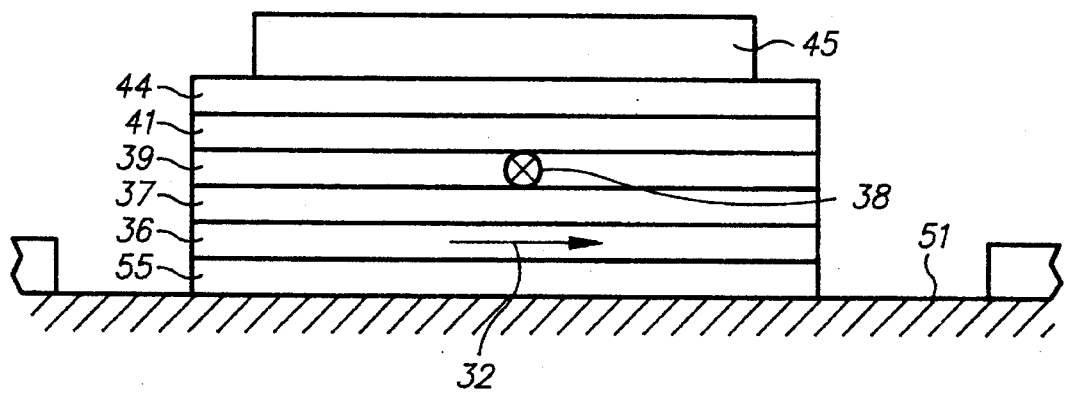

Referring now to FIGS. 7A–7B, the fabrication of typical SV element B will be described. A 50 Å thick tantalum (Ta) underlayer 55 is deposited on buffer layer 51. As shown in FIG. 7A, a first ferromagnetic layer 36 is deposited on buffer layer 51. The layer 36 is the free ferromagnetic layer in the SV element and is preferably formed of Ni-Fe in the composition range of $Ni_{80}Fe_{20}$ to $Ni_{85}Fe_{15}$ and to a thickness of 10–100 Å. A thin nonferromagnetic metallic spacer layer 37, a second thin layer 39 of ferromagnetic material, a thin layer 41 of an exchange biasing material having relatively high resistance and being in direct contact with the ferromagnetic layer 39, and a Ta capping layer 44 are deposited over ferromagnetic layer 36. The second ferromagnetic layer 39 will become the pinned layer and is also formed of Ni-Fe to a thickness of 10–100 Å. The nonmagnetic spacer layer 37 is preferably copper (Cu) and formed to a thickness of 20–40 Å. The exchange bias layer 41 is preferably made of a suitable antiferromagnetic material, such as iron-manganese (Fe-Mn) or nickel-manganese (Ni-Mn), and formed to a thickness of 100–400 Å.

Although not shown in FIGS. 7A–7D, in the preferred embodiment of each SV element the free and pinned ferromagnetic layers 36 and 39, respectively, each comprises a thin film of Co (5–15 Å thick) next to the Cu spacer layer 37 and a thin film of Ni-Fe (10–100 Å thick), as shown in the previously cited '261 patent. This produces a larger ΔR/R and a larger output voltage. The data in FIG. 3 corresponds to a field sensor made with such SV elements.

The ferromagnetic layer 36 is called the "free" ferromagnetic layer because it will be free to rotate its direction of magnetization 32 in response to an externally-applied magnetic field (magnetic field H shown in FIG. 1). The ferromagnetic layer 39 is called the "pinned" ferromagnetic layer because its magnetization direction will be fixed or pinned in a preferred orientation, as shown by the arrow 38, and unable to rotate in the presence of an externally-applied magnetic field.

Photoresist is then patterned over the capping layer 44 to define the individual rectangularly-shaped SV elements A–D, and all of the layers 36, 37, 39, 41, 44 not protected by photoresist are then removed by conventional removal techniques, such as ion milling, down to and slightly into underlayer 55. As shown in FIG. 7B, this creates well-defined edges that define the length L and width W of each of the SV elements. FIGS. 7A–7B thus illustrate the manner of forming the SV elements, such as typical SV element B in FIG. 6. The next step is the formation of the conductor pads, such as pads 54, 56, to electrically connect the SV elements.

Figure 7C:
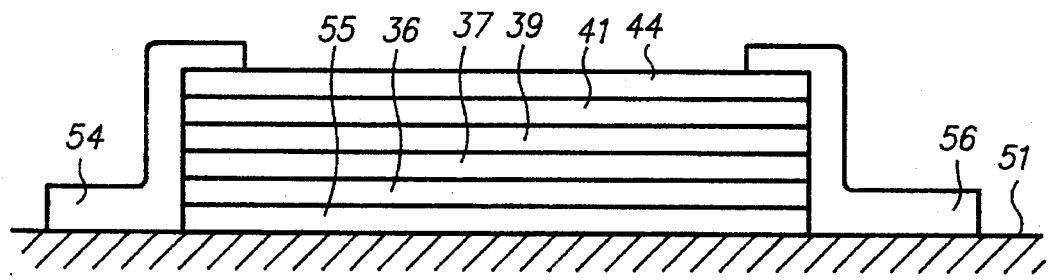
Figure 7D:
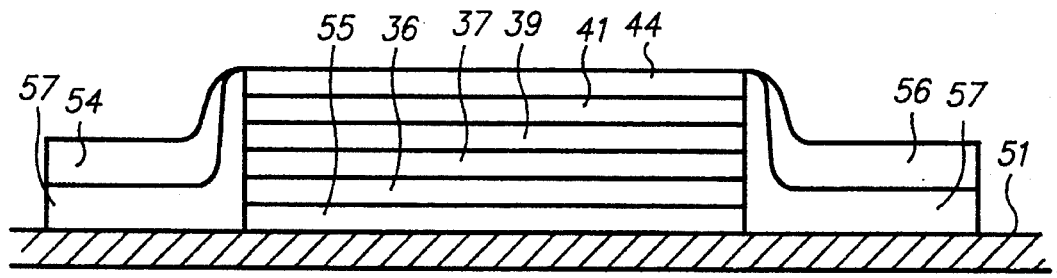

Referring now to FIG. 7B, photoresist 45 is patterned over the SV elements to form the electrical conductor pads, such as pads 54, 56 (FIG. 7C). In one approach, the electrical conductors are formed of sequentially-deposited layers of Ta, Au, and Ta to a total thickness of 1000 Å. Electrical connection to each SV element is made by depositing the pads onto the SV element and then lifting off the photoresist and metal, leaving the pads (FIG. 7C). In another approach, the SV element ends are first ion milled to remove material and then either Ni-Fe and exchange material or hard material (CoPtCr) is deposited as layer 57, followed by the deposition of Ta/Au/Ta. The photoresist and metal is then lifted off to form the shapes of the pads 54, 56, as shown in FIG. 7D.

While the embodiment of typical SV element B shown in FIGS. 7A–7B has the free layer 36 located closer than the pinned layer 39 to the underlayer 51, it is also possible to form the SV element in an inverted manner, i.e., with the pinned layer closer to the underlayer. In that structure, the antiferromagnetic layer 41 for pinning the pinned layer 39 would be located between the underlayer 55 and the pinned layer 39.

Referring again to FIG. 6, the conductor pads, such as pads 54, 52, 56, define an electrical pathway interconnecting all of the SV elements A–D. After formation of the pads and removal of the photoresist, an intermediate insulating layer 60, preferably of alumina ($Al_2O_3$), is deposited as a sheet to a thickness of approximately 1500 Å to completely cover the pads 54, 52, 56, and the SV elements. Additional photoresist is then applied and patterned to define the SV element fixing layer 70 that is formed over the alumina insulating layer 60. The conductive fixing layer 70 is preferably gold (Au) and deposited to a thickness of approximately 2000 Å. An additional top insulating layer 80 of alumina (not shown in FIGS. 4 and 5) is deposited as a protective overcoat to cover over all of the films forming the sensor 10. Finally, vias are formed in the conventional manner through the top insulating layer 80 down to fixing layer 70 to form the terminal leads for the fixing layer 70 (lead 72 is shown in FIG. 6), and down through insulating layers 80 and 60 to form the terminal leads for the conductor pads (lead 26 is shown in FIG. 6).

Following these fabrication steps, it is next necessary to pin each of the pinned layers, such as layer 39 in SV element B (FIG. 1), so that their magnetizations are permanently fixed in the proper direction (arrow 38 for pinned layer 39 of SV element B). This is necessary so that the magnetizations of each of the pinned layers is oriented perpendicular to the direction of current flow through the respective SV element, and in the respective directions shown in FIG. 1. It is not possible to pin the magnetizations of the four different pinned layers in different directions using the prior art SV element fabrication process because the use of an external applied field to do the fixing would orient all of the magnetizations to be in the same direction, which would render the sensor 10 unusable as a bridge circuit magnetic field sensor. The permanent pinning of the pinned layers in their proper orientations is made possible by the conductive fixing layer 70.

Referring again to FIGS. 4 and 5, a fixing current is applied through the leads 72, 74 on conductive fixing layer 70 (leads 76, 78 are not used for the fixing process but are reserved for other applications described below). The value of this current is selected so that a magnetic field associated with the current has sufficient magnitude to orient the magnetizations of the pinned layers in the proper direction. The direction of current through each leg of fixing layer 70 is shown by arrows 91, 92, 93, 94 for SV elements A, B, C, D, respectively. The magnetizations of the pinned layers in each of the SV elements will be oriented in a direction determined by the well-known "right-hand rule". These directions are as shown for the pinned layers in FIG. 1. If the width of the fixing layer 70 over the SV elements is 10 microns, a 230 mA current through fixing layer 70 will produce a magnetic field of approximately 145 Oe. The direction of this field is either "up" or "down", depending upon the current direction in each leg of the bridge, i.e., each SV element A–D. While the fixing current is being applied, the sensor 10 is heated to approximately 160°–180° C. if the antiferromagnetic pinning layer is Fe-Mn. This temperature is above the temperature required to set the sublattice magnetization of the Fe-Mn to align with the magnetization of the adjacent pinned layer. In the case of Fe-Mn this setting temperature is called the blocking temperature. The magnetizations of both the free and pinned Ni-Fe layers will be aligned with the field created by the fixing current. Because the Ni-Fe pinned layers are exchange coupled to the adjacent Fe-Mn layers, their magnetizations will be aligned parallel with the magnetizations of their associated Fe-Mn antiferromagnetic layers. The sensor is then cooled while the fixing current continues to be applied. After cooling, the Fe-Mn antiferromagnetic layers have their sublattice magnetization orientations permanently fixed which also permanently pins the exchange-coupled pinned layer magnetizations in the desired orientation. When the fixing current is turned off, the magnetization directions of the free layers return to their original state, which is generally parallel to the length L of the SV elements. This process for permanently fixing the magnetization directions of the different pinned layers in different directions, even though the individual SV elements are all formed on the same substrate, creates the balanced bridge in which each leg responds in an opposite sense to the external magnetic field to be sensed.

The value of the fixing current, the dimensions of the fixing layer, and the fixing procedure are important to attain as large a ΔR/R as possible for the SV elements. An overlap between the fixing current layer 70 and the SV elements is required for ease of manufacturability to accommodate layer alignment and layer width tolerances, as well as good field uniformity. This overlap should be a minimum of 3 times the thickness of the insulating layer 60. The overlap means that the width of the conductor in layer 70 should overlap the width W of each SV element. This overlap can be approximately 3 microns on each side of the SV elements. In the embodiment described and shown in FIG. 4, the width of the SV elements is 3.3 microns and the width of the fixing conductor overlying the SV elements is 10 microns.

The current in the fixing layer 70 determines the transverse field, $H_T$, applied on the SV elements by the following equation:

$$H_T = 2\pi I / W_F \qquad (6)$$

where I is in mA, $W_F$ is the width of the conductor in microns, and $H_T$ is the field in Oe. The value of the field $H_T$ should be a minimum of 2 $H_{k(eff)}$ since it needs to overcome the shape anisotropy fields of both the free and pinned layers as the SV elements are heated above their setting temperature. Since $H_{k(eff)}$ includes only an average value for the shape anisotropy field, a value of $H_T$ in the range of 3–10 $H_{k(eff)}$ should be used to ensure that the edges of the pinned layers are also aligned properly. For the example shown in FIG. 4, $H_T = 7 H_{k(eff)}$ was used to fix the pinned layers.

The field sensor 10 is heated by both the heat generated by the fixing current and the ambient heat (typically from an oven) to raise its temperature. If Fe-Mn is used for the exchange bias layers, this temperature is typically 160°–180° C., which is the upper edge of the blocking temperature distribution for Fe-Mn. Other antiferromagnetic materials may be chosen for the exchange bias layers and will require different temperatures. Ni-Mn, for example, has a setting temperature of approximately 240° C. and must be annealed for 1–3 hours at this temperature to set the exchange field in the desired orientation for the pinned layers. If Ni-Mn is raised above this temperature then the annealing time can be shortened. For the case of Ni-Mn, the setting temperature is not the blocking temperature, but rather the temperature at which the tetragonal phase transition occurs. The maximum preferred temperatures are 200° C. for Fe-Mn and 250° C. for Ni-Mn while the pinned layers are being fixed to minimize the loss of ΔR/R due to changes in film properties.

A fraction of the heating is provided by the fixing current itself. This contribution to the temperature rise is calculated by measuring the resistance increase of the sensor while the fixing current is on and using the known temperature coefficient of the sensor material. This temperature increase is measured to be in the range of 30°–50° C. Thus, the sensor is placed in an oven whose temperature is the difference between the desired temperature and the temperature increase generated by the fixing current. Depending on the degree of thermal isolation of the sensor, the heating generated by the fixing current alone may exceed the setting temperature. In that case the sensor is kept at the desired temperature by cooling, to ensure that the temperature does not rise significantly above the setting temperature.

If the exchange bias layers are formed of Fe-Mn, the sensor is then cooled to well below the Fe-Mn blocking temperature while the fixing current remains on, at which point all regions of the pinned layers are fixed in the desired orientation. Then the fixing current is turned off. If the exchange bias layers are formed of Ni-Mn instead of Fe-Mn, the sensor is annealed to approximately 240° C. for approximately 1–3 hours while the fixing current continues to be applied to the sensor. This ensures the transformation of the sputtered Ni-Mn to the antiferromagnetic tetragonal phase with a blocking temperature in excess of 400° C. After the Ni-Mn has been annealed for a period of time sufficient to obtain the desired level of exchange bias, the fixing current can be removed and the sensor cooled.

The sensor using Fe-Mn as the antiferromagnetic layer in each of the SV elements will have an operating temperature range up to about 120° C. and a storage temperature of up to about 150° C. The maximum operating temperature can be extended to approximately 180° C. by using Ni-Mn in place of Fe-Mn. The use of Ni-Mn for exchange coupling with Ni-Fe is described by Lin et al. in "Improved Exchange Coupling Between Ferromagnetic Ni-Fe and Antiferromagnetic Ni-Mn-based Films", *Applied Physics Letter*, Vol. 65, No. 9, August 1994, pp. 1183–1185. The use of Ni-Mn in place of Fe-Mn increases the operating temperature of the sensor by about 60° C., but also results in a 15–20 percent loss in signal amplitude due to a lower magnetoresistance, ΔR/R. This is because of interdiffusion within the spin valve layers. This is described by Speriosu et al. in "Role of Interfacial Mixing in Giant Magnetoresistance", *Physical Review B*, Vol. 47, No. 17, May 1, 1993-I, pp. 11579–11582.

The arrangement of the layers as shown in FIG. 5 is the preferred sequence of fabrication of the layers on the substrate. However, the sensor can also be fabricated with the conductive fixing layer 70 located between the substrate and the SV elements, with the insulating layer 60 being located between the conductive fixing layer 70 and the SV elements.

The field sensor as shown and described is designed to function as a sensor for measuring the amplitude of external magnetic fields in the plane of the substrate. However, the sensor can also be operated as a current sensor by applying the current to be measured through the conductive fixing layer 70. The fixing layer then also serves as a current strap for application of the current to be sensed. The current generates a magnetic field according to the equation 6 above, and this field is detected by the bridge sensor. Referring to FIG. 5, current would be injected between leads 76 and 78 of the fixing layer 70 in such an application. Alternatively, a separate current strap can be formed on the sensor separate from the fixing layer to serve as the path for the current to be sensed.

The field sensor can also be built to measure the gradient of the applied field H, rather than the magnitude of the applied field H. Referring to FIG. 1, if during fabrication the fixing current is driven in such a way that SV elements A and C have equal but opposite responses to SV elements B and D, then the bridge will be sensitive to changes in the value of the applied field occurring between SV elements B and D (or equivalently A and C). This arrangement is achieved, for example, by applying the fixing current input to leads 76 and 78 of FIG. 5 during fabrication. Following fabrication of the field sensor as a field gradient sensor, and with the input and output leads connected the same as for the field amplitude sensor (FIG. 1), the field gradient sensor has the response given by the following equation:

$$V_{out} = V_{in} \frac{\Delta R}{R_o} \frac{S}{4H_{k(eff)}} \frac{dH}{dX} \qquad (7)$$

where dH/dX is the gradient of the field in a direction perpendicular to the length L of the elements, and S is the separation of the elements in the same direction. The separation S of SV elements A and C is shown in FIG. 5. The voltage response in equation (7) also provides a measure of the sign of the field gradient.

While in the preferred embodiment of the sensor as both a field sensor and a field gradient sensor, the input and output connections are as shown in FIG. 1 (i.e., input across the first set of leads 20, 22 and output across the second set of leads 24, 26), the sensor will also operate with the input and output connections switched (i.e, input across the second set of leads 24, 26 and output across the first set of leads 20, 22). Such an arrangement will function but will provide less than optimal performance because of the effect of the direction of the input current on the bias points of the SV element free layers. With a suboptimal bias point, the dynamic range of each SV element is reduced, as explained in the previously-cited Heim et al. article.

While the preferred embodiments of the present invention have been illustrated in detail, it should be apparent that modifications and improvements may be made to the invention without departing from the spirit and scope of the invention as described in the following claims.

What is claimed is:

1. A bridge circuit magnetic field sensor for generating an output voltage in response to an external magnetic field, the sensor comprising:

a generally planar substrate;

first, second, third and fourth spin valve elements formed on the substrate, each of the spin valve elements comprising (a) a free ferromagnetic layer having a preferred axis of magnetization in the absence of an applied magnetic field, (b) a nonmagnetic spacer layer adjacent to the free ferromagnetic layer, (c) a pinned ferromagnetic layer adjacent to the spacer layer, and (d) an exchange bias layer of antiferromagnetic material adjacent to and in contact with the pinned ferromagnetic layer for pinning the magnetization of the pinned layer in a direction generally perpendicular to the preferred axis of magnetization of the free ferromagnetic layer, the preferred axes of magnetization of the free layers in the four spin valve elements being substantially parallel to one another, the direction of magnetization of the pinned layers in the first and second spin valve elements being substantially antiparallel to one another and the direction of magnetization of the pinned layers in the third and fourth spin valve elements being substantially antiparallel to one another;

a first electrically conductive layer formed on the substrate and interconnecting the first and second spin valve elements, the second and fourth spin valve elements, the fourth and third spin valve elements and and the third and first spin valve elements, the first conductive layer including terminal leads located between adjacent spin valve elements, the terminal leads between the first and second spin valve elements and between the third and fourth spin valve elements forming a first set of leads and the terminal leads between the first and third spin valve elements and between the second and fourth spin valve elements forming a second set of terminal leads;

a second electrically conductive layer formed on the substrate and aligned with the spin valve elements for conduction of a fixing current to orient the direction of magnetization of the pinned layers of the spin valve elements during fabrication of the sensor; and an insulating layer formed on the substrate between the spin valve elements and the second electrically conductive layer to electrically insulate the spin valve elements from the second electrically conductive layer.

2. The magnetic field sensor according to claim 1 wherein the first and fourth spin valve elements have their pinned layer magnetization directions aligned parallel to each other, and further comprising a power source connected across the first set of terminal leads; whereby an output voltage across the second set of terminal leads is a measure of an external magnetic field component that is substantially in the plane of the substrate.

3. The magnetic field sensor according to claim 1 wherein the first and third spin valve elements have their pinned layer magnetization directions aligned parallel to each other, and further comprising a power source connected across the first set of terminal leads; whereby an output voltage across the second set of terminal leads is a measure of the change of an external magnetic field component that is substantially in the plane of the substrate with distance along an axis generally parallel to the magnetization directions of the pinned layers.

4. The magnetic field sensor according to claim 1 wherein the insulating layer has an inherent thickness, wherein the spin valve elements are generally rectangularly shaped with a length and a width, and wherein the second electrically conductive layer overlaps the width of the spin valve elements on each side of the spin valve elements by a distance greater than approximately three times the thickness of the insulating layer located between the spin valve elements and the second electrical conductor.

5. The magnetic field sensor according to claim 1 wherein the second electrical conductor is a current strap formed on the substrate for receipt of a current to be measured after fabrication of the sensor, and wherein the magnetic field sensor measures the current through the current strap by sensing the magnetic field associated with the current through the current strap.

6. The magnetic field sensor according to claim 1 wherein the exchange bias layer comprises iron-manganese or nickel-iron.

7. A bridge circuit magnetic field sensor for generating an output voltage in response to an external magnetic field, the sensor comprising:

a generally planar substrate;

first, second, third and fourth generally rectangularly shaped spin valve elements having inherent widths and lengths and formed on the substrate with their lengths oriented generally parallel, each of the spin valve elements comprising (a) a free ferromagnetic layer having a preferred axis of magnetization oriented generally parallel to the length of the spin valve element in the absence of an applied magnetic field, (b) a nonmagnetic spacer layer adjacent to the free ferromagnetic layer, (c) a pinned ferromagnetic layer adjacent to the spacer layer, and (d) an exchange bias layer of antiferromagnetic material adjacent to and in contact with the pinned ferromagnetic layer for pinning the magnetization of the pinned layer in a direction generally parallel to the width of the spin valve element, the direction of magnetization of the pinned layers in the first and fourth spin valve elements being substantially parallel to one another and substantially antiparallel to the direction of magnetization of the other two pinned layers;

a first electrically conductive layer formed on the substrate and interconnecting the first and second spin valve elements, the second and fourth spin valve elements, the fourth and third spin valve elements and and the third and first spin valve elements, the first conductive layer including terminal leads located between adjacent spin valve elements, the terminal leads between the first and second spin valve elements and between the third and fourth spin valve elements being for the application of sensor input power and the terminal leads between the first and third spin valve elements and between the second and fourth spin valve elements being for the sensor output voltage;

a second electrically conductive layer formed on the substrate and aligned with the spin valve elements for conduction of a fixing current to orient the direction of magnetization of the pinned layers of the spin valve elements during fabrication of the sensor;

an insulating layer between the spin valve elements and the second electrically conductive layer to electrically insulate the spin valve elements from the second electrically conductive layer; and a power source connected to the input terminal leads; whereby the output voltage provides a measure of the external magnetic field component substantially in the plane of the substrate and in a direction substantially perpendicular to the lengths of the spin valve elements.

* * * * *

UNITED STATES PATENT AND TRADEMARK OFFICE
CERTIFICATE OF CORRECTION

PATENT NO. : 5,561,368
DATED : October 1, 1996
INVENTOR(S) : Moris M. Dovek et al.

It is certified that error appears in the above-identified patent and that said Letters Patent is hereby corrected as shown below:

Col. 11, line 10, delete the second instance of "and".

Col. 12, line 5, delete "nickel-iron" and replace with --nickel-manganese--.

line 33, delete the second instance of "and".

Signed and Sealed this

Eleventh Day of February, 1997

Attest:

BRUCE LEHMAN

*Attesting Officer*    *Commissioner of Patents and Trademarks*